(12) United States Patent
Chou et al.

(10) Patent No.: US 7,576,986 B2
(45) Date of Patent: Aug. 18, 2009

(54) THERMAL DISSIPATING DEVICE

(75) Inventors: Ming-Der Chou, Taipei Hsien (TW); Yao-Tin Chang, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 56 days.

(21) Appl. No.: 11/960,742

(22) Filed: Dec. 20, 2007

(65) Prior Publication Data

US 2008/0310122 A1 Dec. 18, 2008

(30) Foreign Application Priority Data

Jun. 15, 2007 (CN) .................... 2007 2 0200476 U

(51) Int. Cl.
*H05K 7/20* (2006.01)
(52) U.S. Cl. ...................... 361/700; 361/719; 174/15.2; 257/715; 165/80.4; 165/104.26
(58) Field of Classification Search ........................ None
See application file for complete search history.

(56) References Cited

U.S. PATENT DOCUMENTS 6,058,012 A * 5/2000 Cooper et al. ............... 361/704
6,397,941 B1 * 6/2002 McCullough ................ 165/185
6,871,702 B2 * 3/2005 Horng et al. ........... 165/104.33
7,343,962 B2 * 3/2008 Xia et al. .................... 165/80.3
7,405,937 B1 * 7/2008 Wang et al. .................. 361/700
7,440,279 B2 * 10/2008 Lai et al. ..................... 361/700
2007/0074857 A1 * 4/2007 Xia et al. ............... 165/104.33

* cited by examiner

*Primary Examiner*—Boris L Chervinsky
(74) *Attorney, Agent, or Firm*—Frank R. Niranjan

(57) ABSTRACT

An exemplary thermal dissipating device is for cooling an electronic component of a circuit board. The thermal dissipating device includes a heat conductive plate with a first side and a second side opposite to the first side, a plurality of heat pipes, and a plurality of fin arrays. The heat conductive plate includes a first part with the first side in closely contact with the electronic component, and a second part perpendicularly disposed beside the first part. The heat pipes are embedded in the second side of the conductive plate, extending from the first part to the second part. One of the fin arrays is attached to the second side of the first part of the conductive plate. The others of the fin arrays are attached to the second part of the conductive plate the first and second sides respectively.

9 Claims, 4 Drawing Sheets

THERMAL DISSIPATING DEVICE

BACKGROUND

1. Field of the Invention

The present invention relates to thermal dissipating devices, and particularly to a thermal dissipating device for cooling an electronic component of a circuit board.

2. Description of Related Art

Thermal dissipation devices are popularly used in electrical devices, such as a computer or a server. Typically, a CPU in the computer or server has a thermal dissipation device for increasing the heat conduction performance. If the performance of the thermal dissipation device is not good, the CPU may over-heat losing speed or even failing altogether. Therefore, a good thermal dissipation device is a very important component for electronic devices. A traditional thermal dissipation device for conducting heat to the outside includes a heat sink and a fan. An upper side of the heat sink usually connects with the fan, and a lower side of the heat sink usually connects with heat producing electronic component (such as a CPU). To get better heat dissipation performance, heat pipes may be embedded in a base of the heat sink. However, the heat sink, the fan, and the heat pipes of the traditional thermal dissipation device are typically arranged in a direction perpendicular to the electronic component, which may inhibit heat dissipation efficiency thereof.

What is desired, therefore, is a thermal dissipating device efficient in removing heat from electronic components.

SUMMARY

An exemplary thermal dissipating device is for cooling an electronic component of a circuit board. The thermal dissipating device includes a heat conductive plate with a first side and a second side opposite to the first side, a plurality of heat pipes, and a plurality of fin arrays. The heat conductive plate includes a first part with the first side in closely contact with the electronic component, and a second part perpendicularly disposed beside the first part. The heat pipes are embedded in the second side of the conductive plate, extending from the first part to the second part. One of the fin arrays is attached to the second side of the first part of the conductive plate. The others of the fin arrays are attached to the second part of the conductive plate the first and second sides respectively.

Other advantages and novel features will become more apparent from the following detailed description when taken in conjunction with the accompanying drawings, in which:

DETAILED DESCRIPTION OF THE EMBODIMENT

Figure 1:
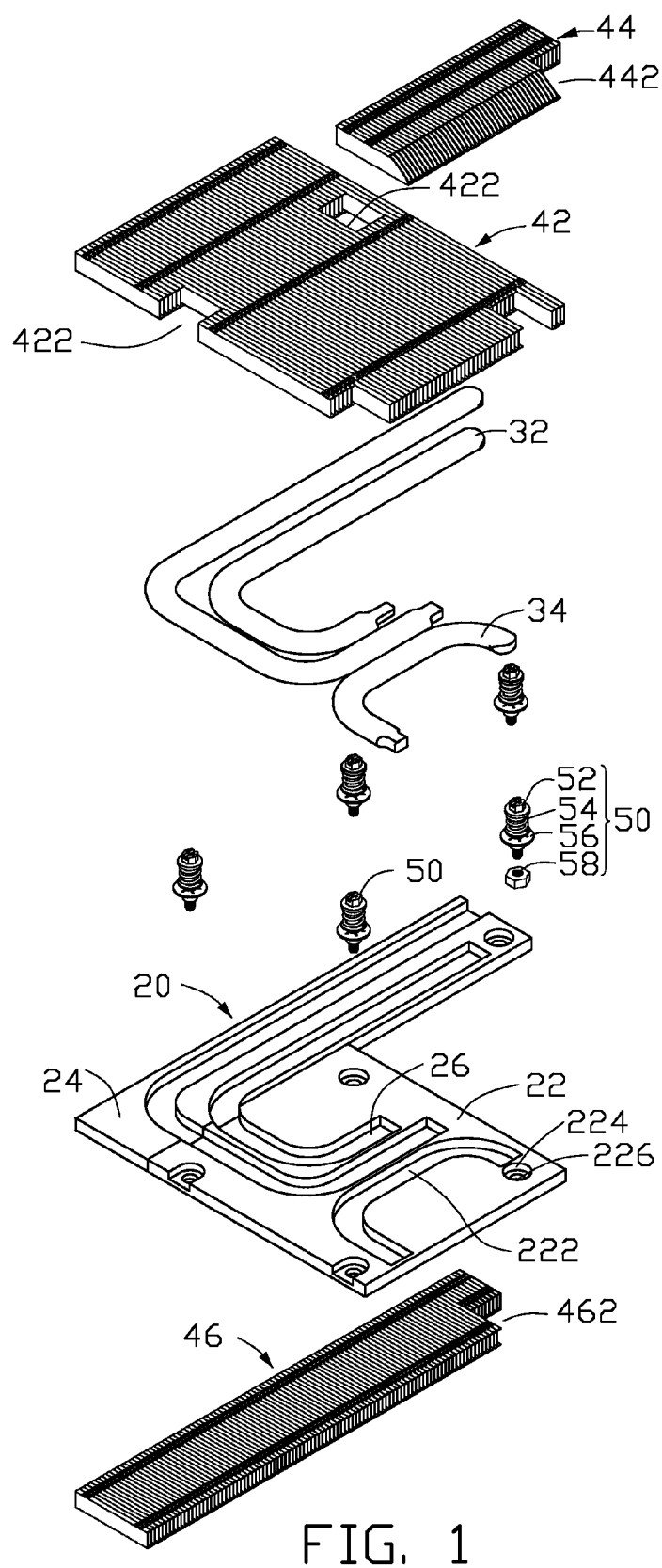
FIG. 1 is an exploded, isometric view of a thermal dissipating device of an embodiment of the present invention.
Figure 4:
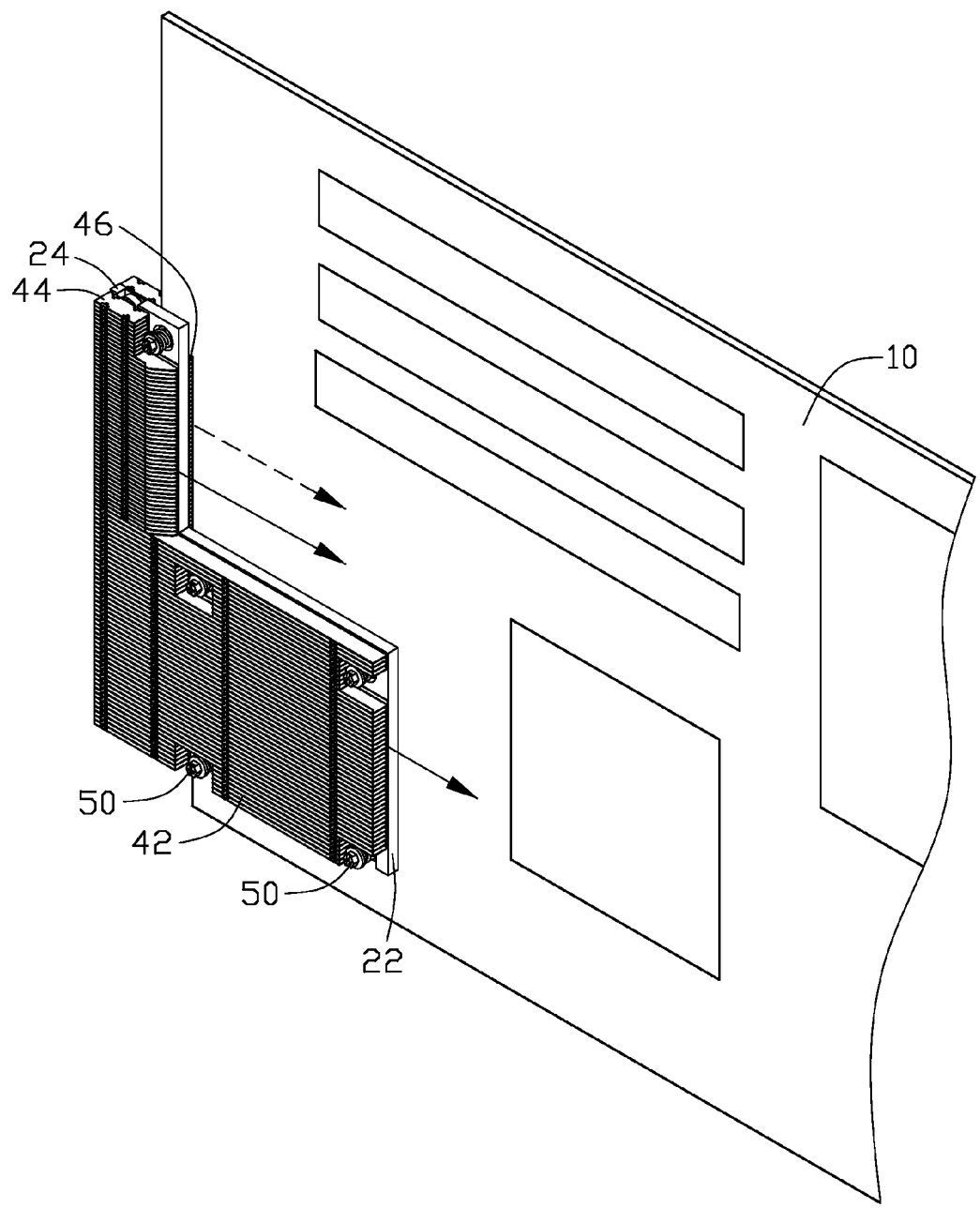
FIG. 4 is an assembled view of the thermal dissipating device of FIG. 1 and a circuit board.

Referring to FIGS. 1 and 4, a thermal dissipating device in accordance with an embodiment of the present invention is for cooling electronic components of a circuit board 10, especially for cooling components arranged at edge portions of the circuit board 10. A plurality of mounting holes (not shown) is defined around the electronic components of the circuit board 10. The thermal dissipating device includes a heat conductive plate 20, a plurality of heat pipes embedded in the conductive plate 20, a plurality of fin arrays attached to the conductive plate 20, and a plurality of fasteners 50.

The heat conductive plate 20 is generally L-shaped and includes a first side covering and closely contacting an electronic component of the circuit board 10, and a second side opposite to the first side. The conductive plate 20 includes a first part 22, and a second part 24 perpendicularly disposed beside the first part 22. A C-shaped channel 222 and two L-shaped channels 26 are defined in a second side of the heat conductive plate 20. The C-shaped channel 222 is arranged in the first part 22 and the second L-shaped channels 26 extends from the first part 22 to the second part 24. A plurality of recesses 224 is defined in the heat conductive plate 20. A through hole 226 is defined in each of the recesses 224.

The plurality of heat pipes includes a C-shaped heat pipe 34, and two L-shaped heat pipes 32, respectively received in the first channel 222 and the second channels 26 of the heat conductive plate 20.

The plurality of fin arrays includes a first fin array 42, a second fin array 44, and a third fin array 46. The first fin array 42 has a generally rectangular shape. The second fin array 44 and the third fin array 46 have comparatively narrow rectangular shapes relative to the first fin array 42, and have different lengths. A plurality of openings 422 is defined in the first fin array 42. A cutout 442 is defined in a corner of the second fin array 44. A cutout 462 is defined in a corner of the third fin array 46.

Each fastener 50 includes a screw 52, a coil spring 54, a gasket 56, and a nut 58.

Figure 2:
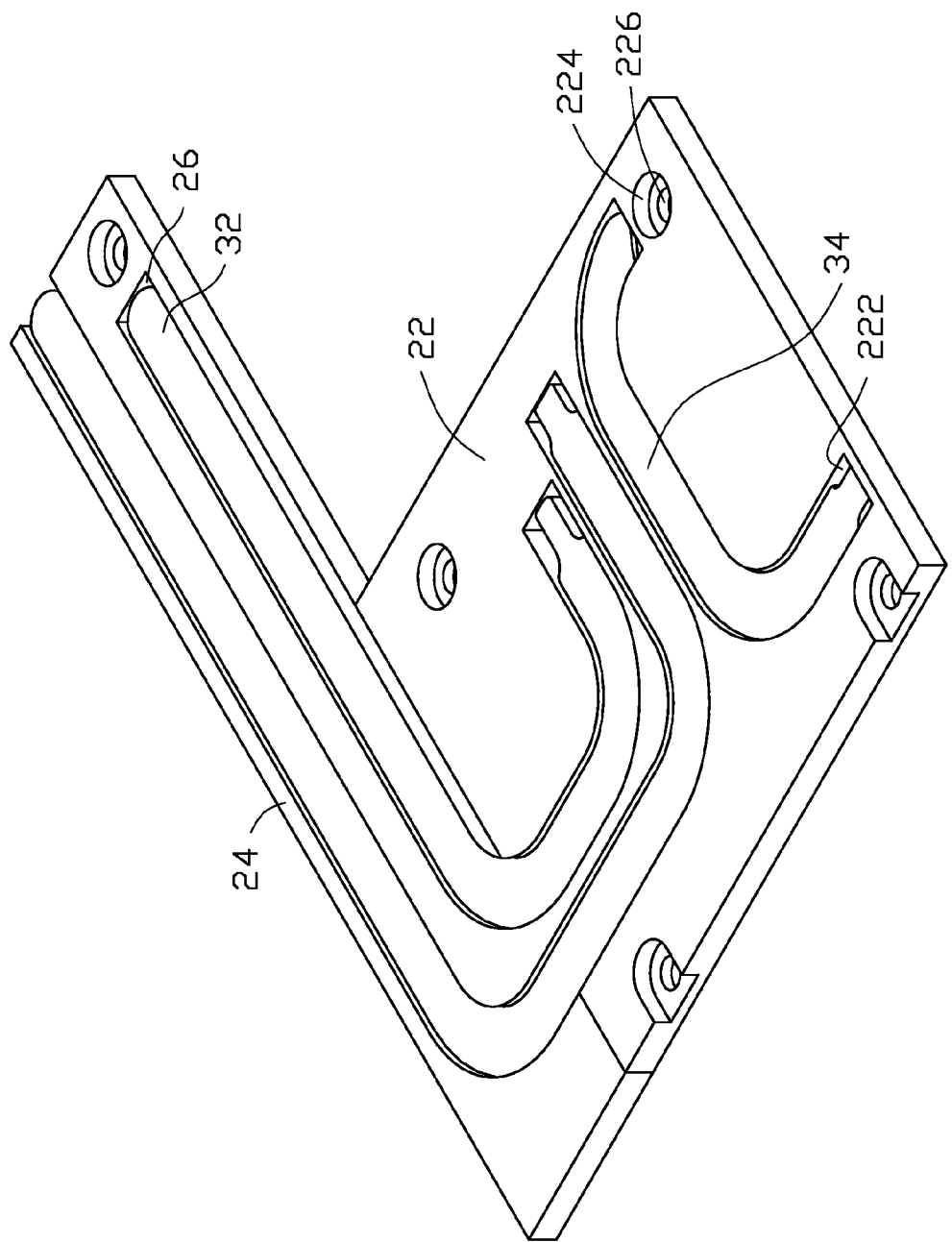
FIG. 2 is a sub-assembly view of the thermal dissipating device of FIG. 1.
Figure 3:
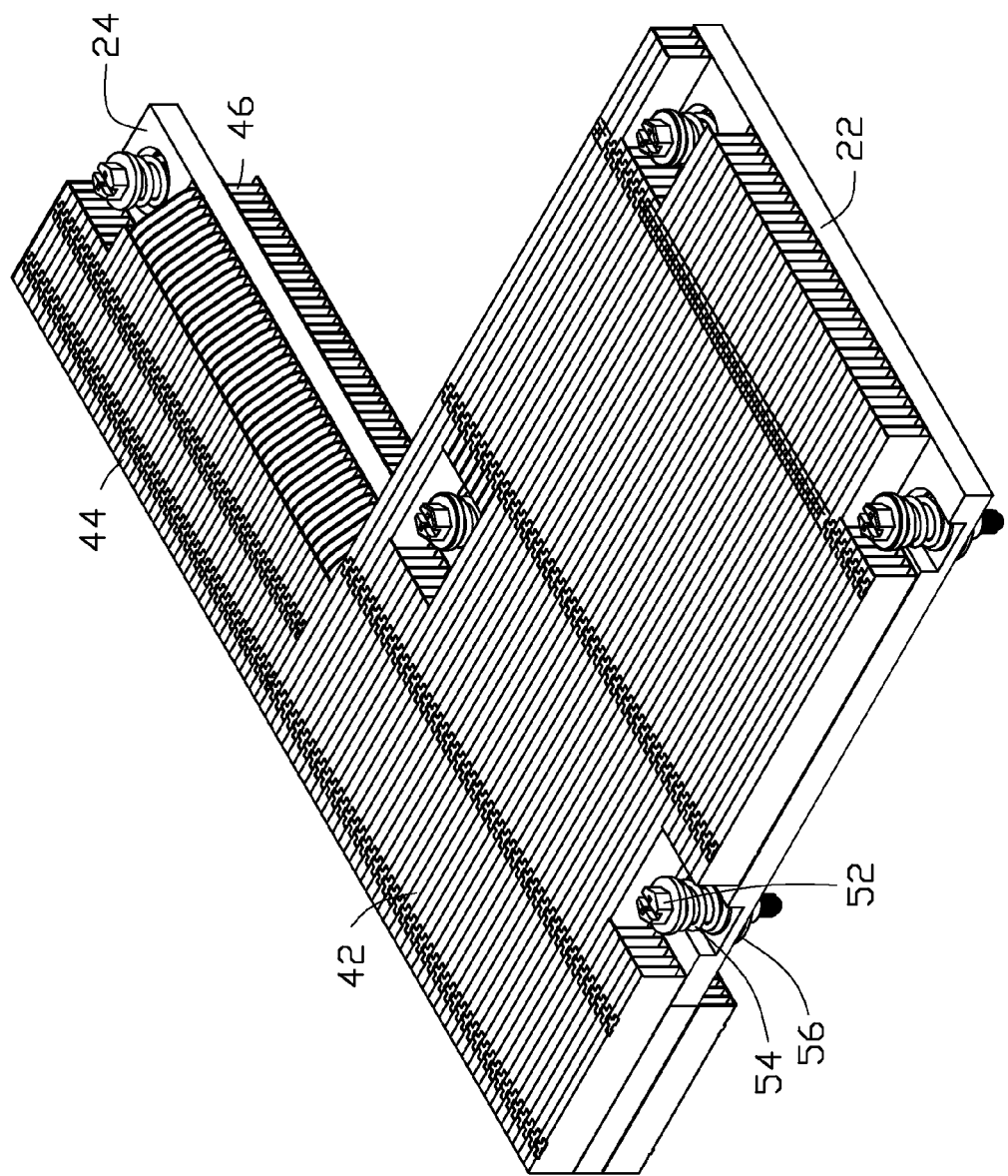
FIG. 3 is an assembled view of the thermal dissipating device of FIG. 1.

Referring to FIGS. 2 and 3, in assembly, the first heat pipe 34 and the second heat pipes 32 are embedded in the C channel 222 and the L channels 26 of the conductive plate 20, respectively. The first fin array 42 is attached to the second side of the heat conductive plate 20 by soldering or welding, extending from the first part 22 to the second part 24. The second fin array 44 is attached to the rest of the second side of the heat conductive plate 20 by soldering or welding, neighboring the first fin array 42. The third fin array 46 is attached to the first side of the second part 24 of the conductive plate 20 by soldering or welding. All of fins of the first fin array 42, the second fin array 44, and the third fin array 46 are parallel. The screws 52 with the coil springs 54 fixed around shafts thereof extend through the openings 422 of the first fin array 42, the cutout 442 of the second fin array 44, and the cutout 462 of the third fin array 46 and the through holes 226 of the heat conductive plate 20. The coil springs 54 are received in the recesses 224 of the conductive plate 20 and abut heads of the screws 52. The gaskets 56 are fixed around the shafts of the screws 52 and abut the first side of the conductive plate 20.

Referring to FIG. 4, the thermal dissipating device is attached to the circuit board 10, with the shafts of the screws 52 extending through the mounting holes of the circuit board 10 around the electronic component to engage with the nuts 58. The first side of first part 22 of the heat conductive plate 20 covers and fully contacts a top surface of the electronic component. Heat generated by the electronic component is directly transferred to the first part 22 of the heat conductive plate 20 and then transferred to the first fin array 42 via the first heat pipe 34 and portions of the second heat pipes 32. At the same time, the heat of the electronic device is also transferred to the second fin array 44 via the second heat pipes 32 and the second part 24 of the heat conductive plate 20. The heat is further transferred to the third fin array 46 by the second heat pipes 32 and the second part 24 of the heat conductive plate 20. The electronic component is well cooled not only by the first fin array 42 arranged in a conventional direction perpendicular to the electronic component but also by the second fin array 44 and the third fin array arranged adjacent to the electronic component.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments.

What is claimed is:

1. A thermal dissipating device for cooling an electronic component of a circuit board, the thermal dissipating device comprising:
    a heat conductive plate comprising a first side closely contacting with the electronic component, and a second side opposite to the first side, the heat conductive plate comprising a first part, and a second part perpendicularly disposed beside the first part;
    a heat pipe embedded in the second side of the conductive plate and extending from the first part to the second part;
    a first fin array attached the second side of the first part of the conductive plate and sandwiched the heat pipe therebetween; and
    a second fin array and a third fin array respectively attached to opposite sides of the second part.

2. The thermal dissipating device as claimed in claim 1, wherein the conductive plate comprises a first channel defined therein, extending from the first part to the second part, to receive the heat pipe therein.

3. The thermal dissipating device as claimed in claim 2, wherein the heat pipe is generally L-shaped.

4. The thermal dissipating device as claimed in claim 2, wherein the first part of the conductive plate comprises a second channel define therein beside the first channel to receive a C-shaped heat pipe therein.

5. The thermal dissipating device as claimed in claim 1, wherein the second fin array is attached to the second part of the heat conductive plate at the same side as the first fin array, sandwiching the first heat pipe between the heat conductive plate and the second fin array.

6. The thermal dissipating device as claimed in claim 4, wherein the third fin array is attached to the second part of the heat conductive at an opposite side to the first fin array.

7. A circuit assembly comprising:
    a circuit board comprising a heat-generating electronic component installed thereon and near an edge thereof; and;
    a thermal dissipation device comprising a heat conductive plate attached on the electronic component, a portion of the conductive plate extending beyond a boundary of the electronic component and leaving a space between the portion of the conductive plate and the circuit board, a plurality of fins extending up from the conductive plate, and a plurality of fins extending down from the portion of the conductive plate and accommodated in the space; wherein the heat conductive plate comprises a first part, and a second part perpendicularly disposed beside the first part, the first part with a first side closely contacting the electronic component, the second part extends beyond the circuit board; wherein the heat dissipation device comprises a plurality of heat pipes embedded in the heat conductive plate extending from the first part to the second part and sandwiched between the conductive plate and the fins.

8. The circuit assembly as claimed in claim 7, wherein the heat conductive plate comprises a first part, and a second part perpendicularly disposed beside the first part, the first part with a first side closely contacting the electronic component, the second part extends beyond the circuit board.

9. The circuit assembly as claimed in claim 8, wherein the heat dissipation device comprises a plurality of heat pipes embedded in the heat conductive plate extending from the first part to the second part and sandwiched between the conductive plate and the fins.

* * * * *